US009065239B2

(12) United States Patent
Joseph et al.

(10) Patent No.: US 9,065,239 B2
(45) Date of Patent: Jun. 23, 2015

(54) MULTIBEAM ARRAY OF TOP EMITTING VCSEL ELEMENTS

(71) Applicant: Trilumina Corporation, Albuquerque, NM (US)

(72) Inventors: John R. Joseph, Albuquerque, NM (US); Kevin L. Lear, Fort Collins, CO (US)

(73) Assignee: TriLumina Corp., Albuquerque, NM (US)

( * ) Notice: Subject to any disclaimer, the term of this patent is extended or adjusted under 35 U.S.C. 154(b) by 52 days.

(21) Appl. No.: 13/865,143

(22) Filed: Apr. 17, 2013

(65) Prior Publication Data

US 2013/0272330 A1  Oct. 17, 2013

Related U.S. Application Data

(60) Provisional application No. 61/625,633, filed on Apr. 17, 2012, provisional application No. 61/675,282, filed on Jul. 24, 2012.

(51) Int. Cl.
| | |
|---|---|
| *H01S 5/024* | (2006.01) |
| *H01S 5/042* | (2006.01) |
| *H01S 5/022* | (2006.01) |
| *H01S 5/183* | (2006.01) |
| *H01S 5/42* | (2006.01) |

(52) U.S. Cl.
CPC ........... *H01S 5/02476* (2013.01); *H01S 5/0224* (2013.01); *H01S 5/02272* (2013.01); *H01S 5/02469* (2013.01); *H01S 5/0425* (2013.01); *H01S 5/18313* (2013.01); *H01S 5/18333* (2013.01); *H01S 5/18391* (2013.01); *H01S 5/423* (2013.01); *H01S 2304/00* (2013.01)

(58) Field of Classification Search
CPC .............. H01S 5/02272; H01S 5/0224; H01S 5/02469; H01S 5/02476; H01S 5/18313; H01S 5/18333; H01S 5/18391; H01S 5/423; H01S 2304/00
See application file for complete search history.

(56) References Cited

U.S. PATENT DOCUMENTS

| | | | |
|---|---|---|---|
| 5,164,949 A | 11/1992 | Ackley et al. | |
| 5,359,618 A | 10/1994 | Lebby et al. | |
| 5,482,891 A * | 1/1996 | Shieh et al. | 438/32 |
| 5,625,617 A * | 4/1997 | Hopkins et al. | 369/121 |
| 6,965,626 B2 * | 11/2005 | Tatum et al. | 372/87 |
| 7,680,168 B2 | 3/2010 | Uchida | |

(Continued)

OTHER PUBLICATIONS

International Patent Application No. PCT/US2013/051905; Preliminary Report on Patentability; dated Sep. 11, 2014; 26 pages.

*Primary Examiner* — Xinning Niu
(74) *Attorney, Agent, or Firm* — Baker & Hostetler LLP

(57) ABSTRACT

A top emitting VCSEL array may be coupled to a separate heat spreading superstrate that may be positioned above the apertures of the array and that may be able to transmit the emitted beams through the heat spreading superstrate. The VCSEL devices in the array may be controlled by an electrical connection to a pattern of conductive elements positioned in close contact with, but electrically isolated from, the heat spreading superstrate. The conductive elements may electrically control one or more of the VCSEL devices to enable sectional control of the light output. The elements may also be arraigned in a ground-signal-ground or coplanar waveguide configuration to improve the frequency response of the array.

32 Claims, 12 Drawing Sheets

(56) References Cited

U.S. PATENT DOCUMENTS

| | | |
|---|---|---|
| 7,957,497 B2 | 6/2011 | Bae |
| 2003/0068142 A1* | 4/2003 | Brezina et al. ............ 385/92 |
| 2006/0109883 A1 | 5/2006 | Lewis et al. |
| 2011/0176567 A1* | 7/2011 | Joseph ............ 372/36 |
| 2012/0051588 A1* | 3/2012 | McEldowney ............ 382/103 |
| 2012/0128015 A1* | 5/2012 | Joseph ............ 372/22 |
| 2012/0128019 A1* | 5/2012 | Chang-Hasnain et al. 372/45.01 |

* cited by examiner

MULTIBEAM ARRAY OF TOP EMITTING VCSEL ELEMENTS

CROSS-REFERENCES TO RELATED APPLICATIONS

This application claims benefit under 35 U.S.C. §119(e) of Provisional Patent Application Nos. 61/625,633, filed Apr. 17, 2012, and 61/675,282, filed Jul. 24, 2012, the contents of which are incorporated herein by reference in their entirety.

TECHNICAL FIELD

The present disclosure is related to semiconductor devices and more particularly to methods of improving the illumination properties and capabilities of arrays of top emitting photonic devices.

BRIEF DESCRIPTION OF DISCLOSURE

A top emitting VCSEL array is described that may be coupled to a separate heat spreading superstrate that may be positioned above the apertures of the array and that may be able to transmit the emitted beams through the heat spreading superstrate. The VCSEL devices in the array may be controlled by an electrical connection to a pattern of conductive elements positioned in close contact with, but electrically isolated from, the heat spreading superstrate. The conductive elements may electrically control one or more of the VCSEL devices to enable sectional control of the light output. The elements may also be arraigned in a ground-signal-ground or coplanar waveguide configuration to improve the frequency response of the array. A method for bonding the superstrate to a wafer or chip scale package is also described that may provide a cost effective method for mounting the VCSEL laser array assembly to a submount for chip scale packaging. The superstrate may be a cost effective thermal and or electrical conductive material with one or more large holes for laser emissions without close alignment.

STATEMENTS AS TO THE RIGHTS TO INVENTIONS MADE UNDER FEDERALLY SPONSORED RESEARCH OR DEVELOPMENT

NOT APPLICABLE.

REFERENCE TO A "SEQUENCE LISTING," A TABLE, OR A COMPUTER PROGRAM LISTING APPENDIX SUBMITTED ON A COMPACT DISK

NOT APPLICABLE.

BACKGROUND

Semiconductor lasers have gained influence in high power laser applications because of their higher efficiency, advantages in SWAP (size, weight and power) and their lower cost over other forms of high power lasers. Many imaging applications require high power illumination such as structured light sources for 3D imaging, LADAR, Time of Flight (TOF) 3D imaging, aviation defense, and fusion research, among others. At present, edge emitting semiconductor lasers or their arrays virtually dominate sales in these fields due to their high power outputs. In the communications field, however, Vertical Cavity Surface Emitting Array (VCSEL) devices have largely replaced edge emitting devices due to the low power applications and high frequency superiority and manufacturing advantages of VCSEL devices (VCSELs) over edge emitter (EE) devices.

VCSELs can be manufactured in arrays much more cost efficiently than EE arrays, but as the area of the VCSEL array grows, heat dissipation from all of the elements can severely limit operational characteristics. Many VCSELs currently use back emitting configurations in order to distribute heat quickly to a heat sinking substrate for improved operation. If arrayed elements are not heat sunk properly, the combined heating effects will have extreme detrimental effects on the properties and lifetime of the photonic devices.

Existing top emitting VCSEL arrays have heat sinking around the VCSEL or covering the VCSEL. This heat sinking can remove heat from the immediate area, but this configuration requires heat to be transported back through the VCSEL substrate, which is formed of Gallium Arsenide (GaAs), which is a poor thermal conductor (0.55 W cm-1° C.-1). This in effect traps the heat being generated on or near the surface, thereby quickly "heating" such devices up to elevated temperatures, which begins to severely impair operational characteristics. VCSEL devices can be fabricated with very high density which exasperates the problem. Top emitting VCSEL designs are especially vulnerable to this problem. VCSEL array devices with wavelengths below ~900 nm most likely are designed to be top emitters as the wavelength will not travel through the substrate due to the GaAs transmission curve.

Many applications require wavelengths lower than 900 nm to illuminate in range sensitive to inexpensive CMOS camera or sensor technology. Illumination from an infrared (IR) or Near infrared (NIR) source is important as the camera can be used in conjunction with narrow bandpass filters or similar pass filters to reduce and other stray or ambient light. This allows only the specific laser wavelength to be detected. Illumination of the field of view can require high powers which in turn require high density arrays of top emitters. As explained earlier, the thermal constraints of such arrays limit their output so the current technology is insufficient for many of the emerging applications.

Fabrication methodologies for VCSEL device arrays as compared to EE array fabrication offer multiple benefits including a much higher level of manufacturability using photolithographic techniques rather than mechanical means to produce multiple emitters in a 2D formation. This makes the VCSEL array emitters very useful for larger arrays, but the heating constraints of the top emitting VCSEL arrays limits operational characteristics so the top emitting VCSEL array designs have not been utilized for such applications due to this problem. It is therefore desirable to develop embodiments of top emitting VCSEL arrays that can operate at much higher outputs and performance because this would enable many new and more powerful illumination, scanning or data transmission devices. VCSEL arrays, if thermally managed properly, could also have benefits above other multibeam semiconductor arrays, including the benefits of VCSEL beam quality, reliability, modulation flexibility, and cost efficiency that would enable VCSEL devices to compete with edge emitting (EE) semiconductor arrays for many applications.

A variety of VCSEL devices and methods for manufacturing such devices are known. See, for example, U.S. Pat. Nos. 5,359,618 and 5,164,949. Forming VCSELs into two-dimensional arrays for data displays is also known. See, U.S. Pat. No. 7,957,497 B2 and U.S. Patent Publication No. 2006/0109883 A1, although the majority of these arrays are for display applications, wavelength division multiplexing, or 2D arrays for individually addressable parallel communications. Flip Chip Multibeam VCSEL arrays for higher output power have been mentioned, such as in U.S. Patent Publication No. 2006/0109883 A1, where the heat can be transferred to a heat sink substrate when using a back emitting design. However, as shown in FIG. 8B of the same document, when using a top emitting design, there is no transfer to a separate heat sink substrate except using the path through the poor thermally conductive device substrate.

The above discussion illustrates the overwhelming problem with top emitters, as the laser emission would be blocked if a substrate were to be placed over the top of the mesas. In particular, top emitting arrays with heat sinking is mentioned in U.S. Pat. No. 7,680,168. However, as noted therein, the heat sinking occurs locally and is not removed from the top of the mesas. As a result, the device distributes the heat to the VCSEL substrate which in turn must transfer the heat through a poor thermal conductive GaAs substrate. This design allows heat build-up at the surface of the higher conductive materials around the actual devices. This heating of the devices contributes to a lower, output power, lower reliability, and a lower frequency response as the junction temperature rises. Also, in current designs, there is a high capacitance problem due to the thin dielectric separation of the P type contact and the N substrate. This high capacitance device dramatically lowers the frequency response. These problems have not been adequately addressed in prior designs.

Semiconductor devices such as lasers, photodetectors, modulators, high electron mobility transistors, resonant tunneling diodes, heterojunction bipolar transistors, and the like, are often used in high-frequency applications. In many cases it is desirable to operate these optoelectronic and electronic devices at higher powers, and higher frequencies with minimal eat generation. It is well known that heat generation negatively affects device lifetime, performance, and the rate of data transmission. Arraying devices together increases heat generation adding to the negative effects on power, lifetimes and high frequency operation. It would therefore be desirable to dissipate heat and reduce parasitic capacitance from a photonic semiconductor device.

BRIEF DESCRIPTION OF THE DRAWING

Non-limiting and non-exhaustive examples will be described with reference to the following figures of the drawing, wherein like reference numerals refer to like parts throughout the various figures.

DETAILED DESCRIPTION OF ILLUSTRATIVE EMBODIMENTS

Figure 1A:
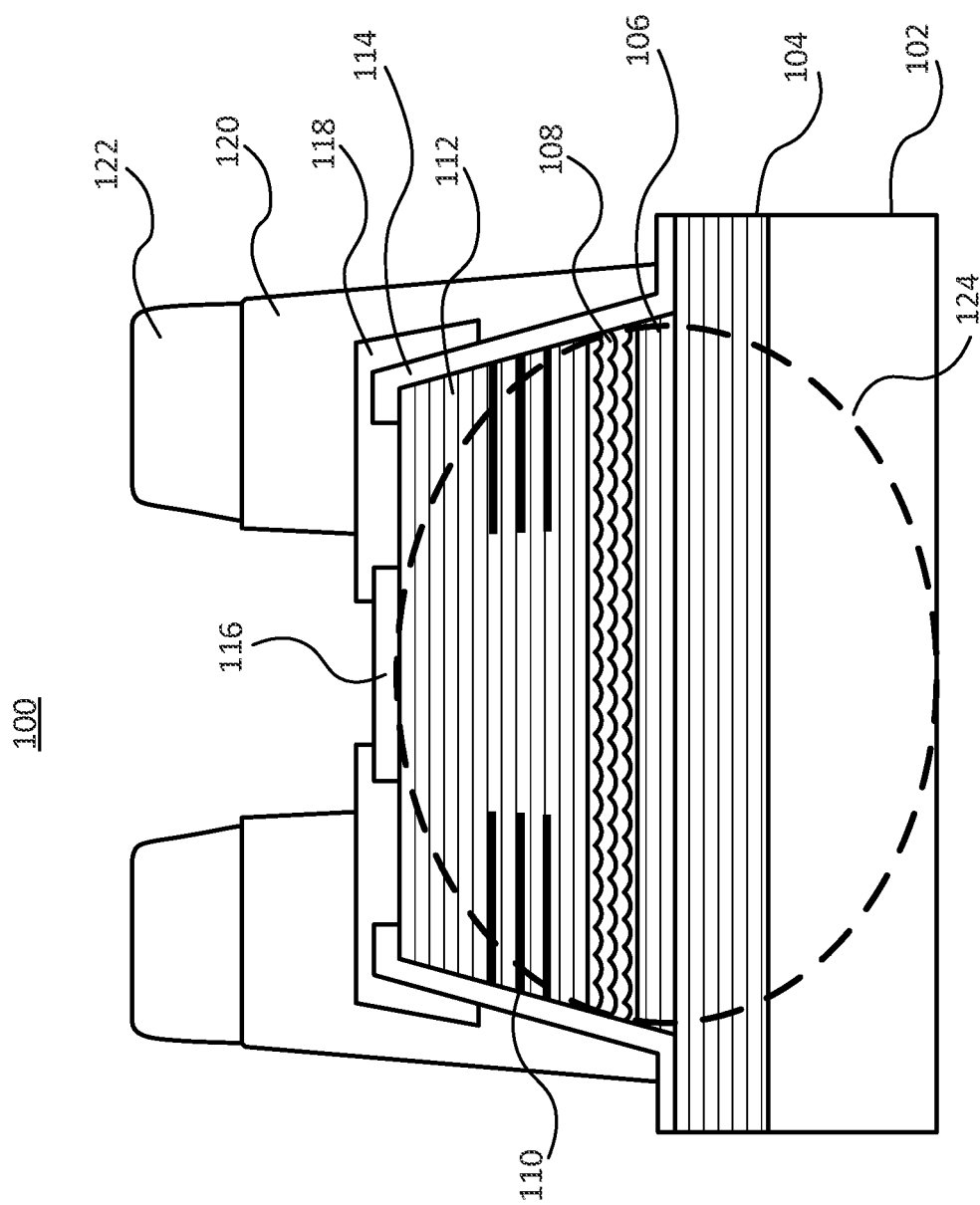
FIG. 1A is a simplified and greatly enlarged sectional view of an embodiment of a top emitting VCSEL array illustrating a first group of several sequential steps in a method of fabricating a multibeam high power device in accordance with an embodiment.

An embodiment is directed to a multibeam optoelectronic device, referred to as a VCSEL array device, which may have high power and may be thermally managed to improve performance from top emitting VCSEL arrays. The VCSEL array device may be a monolithic array of VCSELs comprised of two or more VCSELs and a thermal heat sink substrate positioned on the top of the devices but leaving windows or gaps over the aperture areas for light emission. Top emitting VCSEL arrays have much more difficulty removing heat from the multiple VCSEL devices than back emitting VCSEL arrays. If the heat is not removed from each device and transferred away quickly, the device's operational characteristics can degrade and the performance and reliability of the VCSEL devices will suffer. A dense array will lend itself to even more heat buildup reducing performance of the devices or burning up the devices like a fuse.

An embodiment may position the heat sinking apparatus at the most beneficial area of each device, thereby distributing the heat more evenly and quickly to a separate superstrate situated above the operational VCSEL mesas that are producing the heat. Top emitting VCSEL arrays are much more difficult to thermally manage than back emitting VCSEL arrays. The top emitting VCSEL arrays must transfer the heat through the VCSEL substrate as noted in the Background section.

An embodiment of the top emitting VCSEL array may have the VCSEL devices spaced symmetrically or asymmetrical, spaced according to a mathematical function for improving a power or speed characteristic, or positioned for phase relationships next to each other in an electrically parallel circuit. The devices or VCSEls may be controlled by subgroups in any configuration to sectionally illuminate the field for any number of reasons. The VCSELs of the VCSEL array may be thermally controlled with a thermally conductive mass positioned locally around the mesa and electrically connected to a contact pad forming an element or elements on a heat-spreading superstrate. The local thermal mass may transfer the heat out of the area much faster through direct contact to the heat spreading superstrate, instead of transferring heat through the substrate of the VCSEL, which has a poor thermal conductance.

The array of VCSEL devices may be formed and bonded to a second conductive contact or contacts, known as first elements or mesa devices, which may be either electrically isolated from the heat spreading substrate or electrically connected to the heat spreading substrate but still in close contact with said substrate. These mesa devices form an array of illuminators from which the top optical apertures emit light through the heat sink substrate. Generally the VCSEL substrate ground is the second metal contact. Each VCSEL of the VCSEL array is partly encompassed by a metal heat sink structure, which increases the height of each VCSEL mesa, the heat sink structure and the solder.

The relationship between the heat sink structure, the VCSEL array, and the mesa device array results in the transfer of heat out of the active region of the devices through the heat sink sidewall contacts and distributes the heat to a larger volume heat sink substrate positioned in an area above the devices. The VCSEL apertures emit light through the substrate, which is chosen for thermal conductive properties and for transmission properties, such as SiC or Diamond. In embodiments, the substrate also has patterned electrical connections or elements that transfer signals or current to the VCSELs individually or as grouped in small arrays or to a single element connecting the entire array. In embodiments, the VCSEL apertures may emit light through a substrate which has a hole or holes positioned over the light emitting areas, also in which case other substrate materials could be chosen which are not transparent to the IR, such as Cu.

In embodiments where the VCSEL, array and the VCSEL apertures emit light through the substrate, as noted above, the substrate may be patterned and the pattern of elements or element may be electrically isolated from a conductive heat spreading substrate by a thin dielectric to form a ground-signal-ground waveguide configuration or a coplanar waveguide configuration in the bonded optoelectronic device. This type configuration provides superior signal modulation characteristics.

An embodiment may provide a top emitting multibeam VCSEL array which has high power density through the addition of an additional heat sink substrate in electrical contact with the VCSEL array but positioned "above" the mesas of the array. The word "above" is used herein, in this context and as noted above, as an illustrative description of the general location of the heat sink substrate. The heat sink may be above in terms of an area above the light emitting portion of a device, but not necessarily over the light emitting portion. The heat sink may also be literally above the light emitting portion, except for where a hole or holes have been created to allow light to pass. The monolithic array of VCSELs may be comprised of any number of VCSELs, i.e., more than one, that can be spaced symmetrically or unsymmetrical or spaced according to a mathematical function for improving any power, speed characteristic or positioned for phase relationships or for illuminating sections of a field or crystal.

The VCSEL devices may be positioned next to each other in an electrically parallel circuit where the top mesa contacts are all flip chip bonded to an electrically conductive pad or element or elements on the heat spreading substrate, or more precisely the "superstrate" which may be biased with the signal. The elements formed from an electrical conductive pattern in contact with the surface of the heat spreading superstrate may have any number of VCSEL devices, from one to all of the VCSEL devices in the array, in electrical contact with that element. Each element on the heat spreading superstrate may be contacted with a signal or lead in contact with a package lead or PCB board in order to be used as a control mechanism. A grouping of these elements can be used to turn on and off portions or combinations of portions for a flexible control of the illumination source or to comply with eye safety standards by rapidly turning on each section or sections at different times.

An embodiment may form an integrated multibeam laser or laser-lens assembly comprising an array of vertical cavity surface-emitting lasers. Each of the lasers may comprise an active region consisting of a quantum well or multiple quantum wells and the associated cladding of the active region sandwiched between a first mirror common to, partially common to each of said lasers, or etched through to separate each of the mirrors from each other, and individual electrical contacts for each region positioned below the active region but electrically connected to it and identified as the first region, and a second mirror electrically connected to the active region and individual to each of said lasers with a contact region and an aperture region and electrically connected to a conductive pattern formed on a substrate which is electrically isolated from said pattern and having a high transmission at the wavelengths emitted by said lasers, or the substrate has via holes for transmission through the substrate that extends across the second mirrors, the heat sink structures, and is integrally formed therewith.

Each VCSEL element mesa may be partly encompassed by a metal heat sink structure in said array using the increased height of the mesa and heat sink structure and solder to form a greater distance from other elements, which is beneficial to reduce parasitic capacitance. Each VCSEL element structure may be electrically connected to a patterned conductive region or pad known as an element, in contact with or in close proximity of the heat spreading superstrate. The pattern may be formed in such a way that the VCSEL elements can be operated through the connections on the heat sink substrate either in single elements, groups of elements or to the entire array. The reversed leads on the superstrate have the added advantage of a convenient bond pattern for wafer scale packaging into a submount with pre-patterned leads.

Embodiments may dissipate heat and reduce parasitic capacitance from a semiconductor device array by forming a heat sink proximate to each active mesa element and forming a thermal and conductive path to a separate substrate above the mesas which has the unique ability to transmit the VCSEL light through said substrate. In embodiments, the formation of the mesa and heat sink structure height may increase the distance between the negative and positive potentials formed in the array reducing the overall capacitance of the system. The heat sink structure and contact to the conductive elements may allow addressability by lead formation that would be much more difficult to form on the VCSEL device surface, with its inherent varying height topology. Varied height topology limits the feature size in the photolithography process of forming these layers, so it is beneficial to be able to form the complex lead structures on the flattened surface of the heat spreading substrate instead of the varied topology, which typically can be as much as 10 times the height of the photoresist itself. When such topology exists, the patterning must be accomplished through thicker photoresists and in turn the aspect ratio of the height to feature size limits feature sizes to much larger structures.

In embodiments, the patterned contacts formed on the substrate may have openings which are registered or aligned with the VCSEL array device allowing light emission through the heat spreader superstrate.

In embodiments, frequency performance may be enhanced by the flip chip meso and cooling encasement height standoff of the P and N plates formed by the negative wafer plane and the large area positive plate on the heat transfer substrate. Additionally, the large area of active elements all in parallel may be encompassed by a ground plane which may be designed to create a waveguide and connecting pad with a ground-signal-ground configuration, which may provide for superior signal characteristics and which may allow flexible device testing and packaging. A ground-signal-ground or coplanar waveguide may be designed to match impedances of the driver circuit by simply adjusting the gap width in accordance with the metal and substrate thicknesses and material characteristics.

Figure 4:
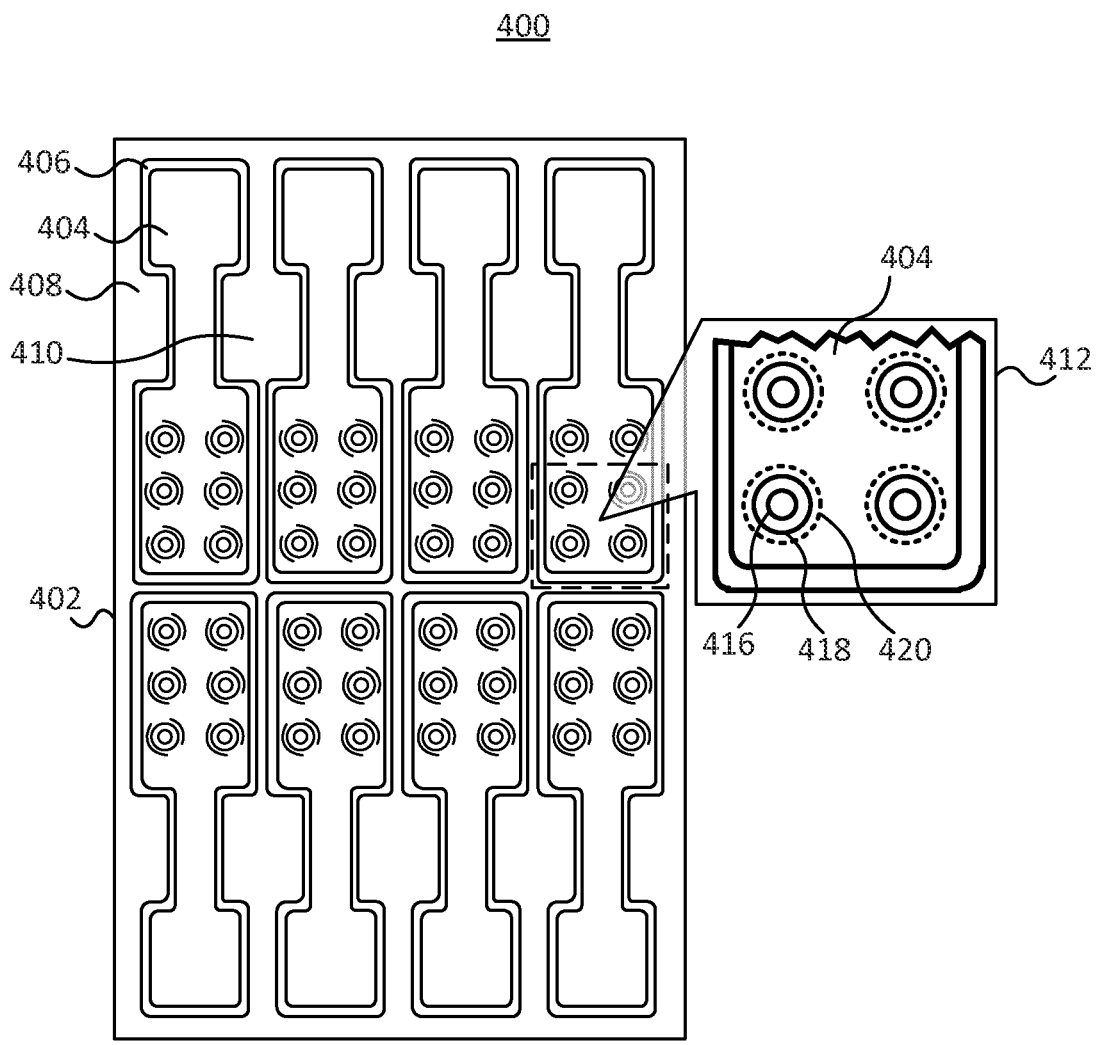
FIG. 4 is a top view of a pattern of elements formed on a superstrate in accordance with an embodiment.

In embodiment where heat sinking is accomplished through the GaAs substrate, a high thermally conductive solder or paste may be used to electrically bond the GaAs substrate to a heat sink submount where the heat sink submount is also used as electrical contacts for the device and a base, and as a mount for mounting lenses or a lens apparatus. This submount could be fabricated out of a Si wafer and have many submounts patterned and fabricated on a wafer scale. The laser chips could be bonded before the Si wafers are diced and separated making an easy electrical test at a level where die costs are less expensive. This embodiment is illustrated in FIG. 4, as further discussed below. After wafer scale testing is complete, the die can be marked as to good or bad or binned according to test characterizations and diced and separated into those groups at a lower cost than is possible when testing individually.

As mentioned above, in a ground-signal-ground configuration, a metal contact pad between elements may be biased with the electrical signal potential. The substrate may be biased with the negative or ground potential. A dielectric layer may be required to isolate the potentials. This type of configuration employs a high capacitance value due to the thin dielectric material that is prevalently used in fabrication, which increases the pad capacitance. In another embodiment the plated cooling structures previously discussed may be formed in the manner discussed above, but instead of having a patterned superstrate bonded to them to remove heat and reduce capacitance, a polyimide layer or low k value dielectric layer may be deposited or formed on the surface of the cooling structures and then photolithographically patterned to open contact areas on the plated cooling structures, while masking the aperture. After curing the polyimide layer, a deposition and plated metal layer may form a heart sink conductive layer on top of the polyimide layer, further reducing pad capacitance while forming a thermal heat sink structure. Reducing capacitance in this manner leads to an increase in frequency response and may be needed to operate in a pulsed or data structure mode.

Referring now to the drawing, FIG. 1A illustrates a VCSEL device 100 formed through a first group of sequential steps necessary to form a complete VCSEL device 100. As shown in FIG. 1A, VCSEL device 100 may comprise a substrate 102, a lower mirror or first mirror 104, first region 106, an active area/region with one or more quantum wells 108, an oxidation layer and oxidation aperture 110, an upper mirror or second mirror 112, a dielectric layer 114, a dielectric aperture or anti-reflective coating aperture 116, a first contact or first electrical contact 118, a heat sink metal layer 120, and a conductive adhesion layer 122. The first group of fabrication steps shown in FIG. 1A illustrates the VCSEL device 100 at the point where the mesa structures have been formed. The mesa structures, loosely illustrated in the area of the dashed line 124, include the first mirror 104 (a series of reflective layers), which are epitaxially grown on the VCSEL array substrate 102, the first region 106, the active region or area 108, and the upper mirror 112, which is also a series of reflective epitaxially grown layers. The first group of fabrication steps also shows that the current confinement process has been completed, which results in the formation of the oxidation layer(s) and opening 110 within the mesa structure 124, and the conformal dielectric deposition 114 over a portion of the mesa structure 124. The first group of fabrication steps further shows openings to and the formation of the first contact surfaces 118, and the aperture region 116 on each VCSEL device in the array. Heat sink plating 120 is shown being formed along with an electrically conductive adhesion layer 122.

Figure 1B:
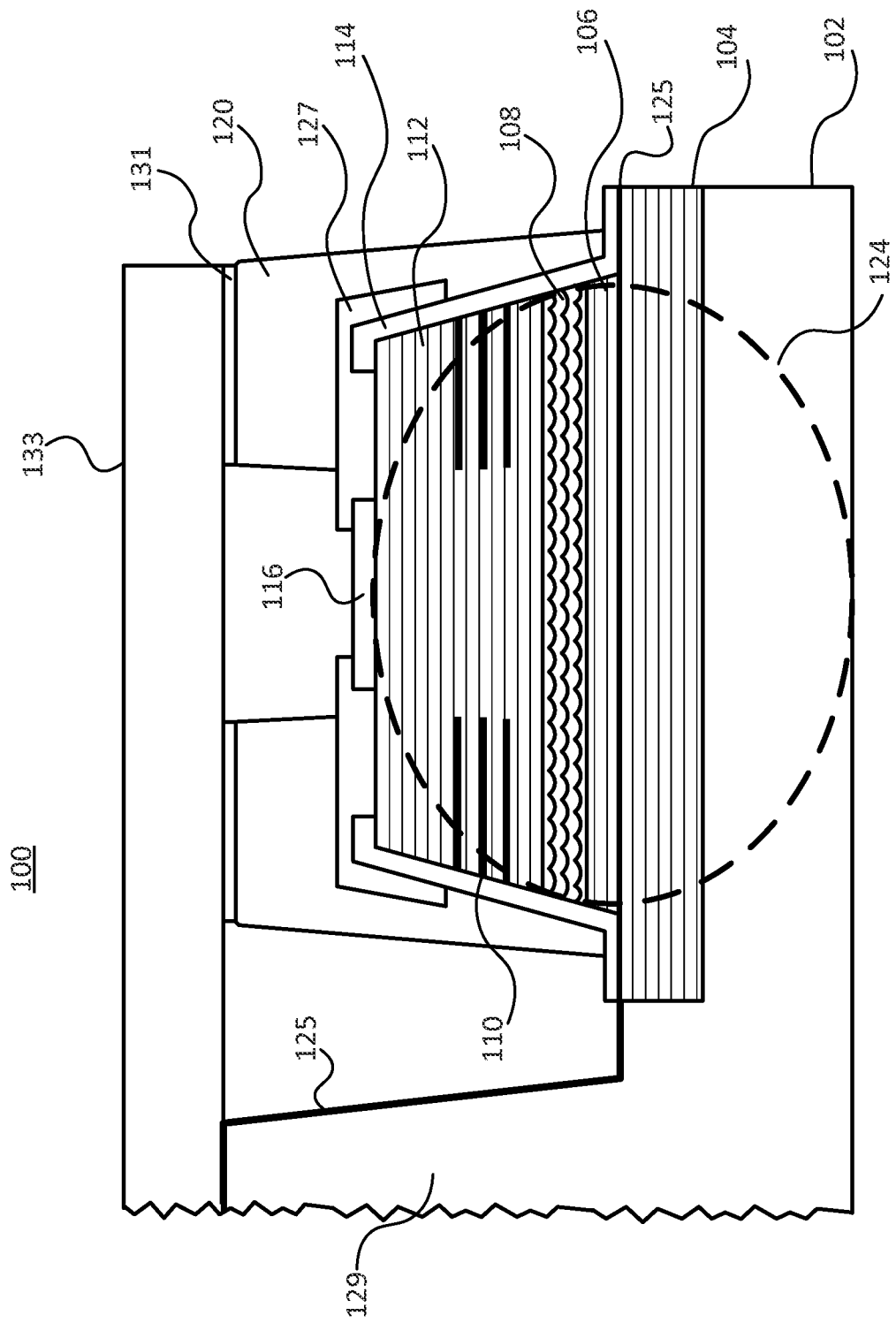
FIG. 1B is a simplified and greatly enlarged sectional view of a different embodiment of the top emitting VCSEL array illustrated in FIG. 1A.
Figure 2:
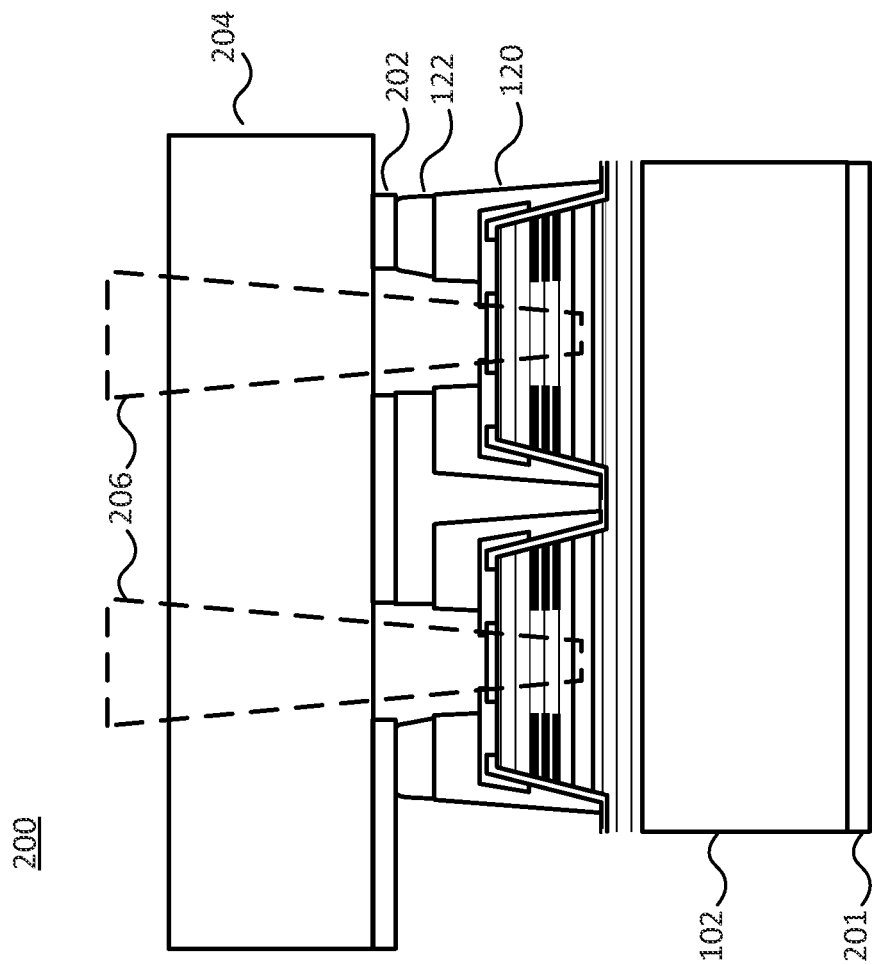
FIG. 2 is a simplified and greatly enlarged sectional view of a top emitting VCSEL array illustrating a second group of several sequential steps in a method of fabricating a multibeam high power device in accordance with an embodiment.

FIG. 2 illustrates two mesa structures of the VCSEL device 200 during a second group of fabrication steps on top of the VCSEL device 100 illustrated in FIG. 1. As shown in FIG. 2, a VCSEL n-contact 201 is formed on the backside of conductive VCSEL substrate 102 and a conductive pad or element 202 and a heat spreading substrate or superstrate 204 is formed over the mesa heat sink structure 120 and adhesion layer 122, FIG. 2 also illustrates two laser beams 206 propagating through superstrate 204. In the embodiment illustrated in FIG. 2, the superstrate 204 is transparent or substantially transparent. FIG. 2 further illustrates the assembled VCSEL laser array device 100 bonded to the heat spreading superstrate 204 with a patterned conductive element 202 adhered (via adhesion layer 122) to the mesa heat sink structure 120, which partially encases the mesas structures 124, which are built on the VCSEL substrate 102 and have the ground n-contact 200 on the bottom of the VCSEL substrate 102 for electrical contact.

Figure 3:
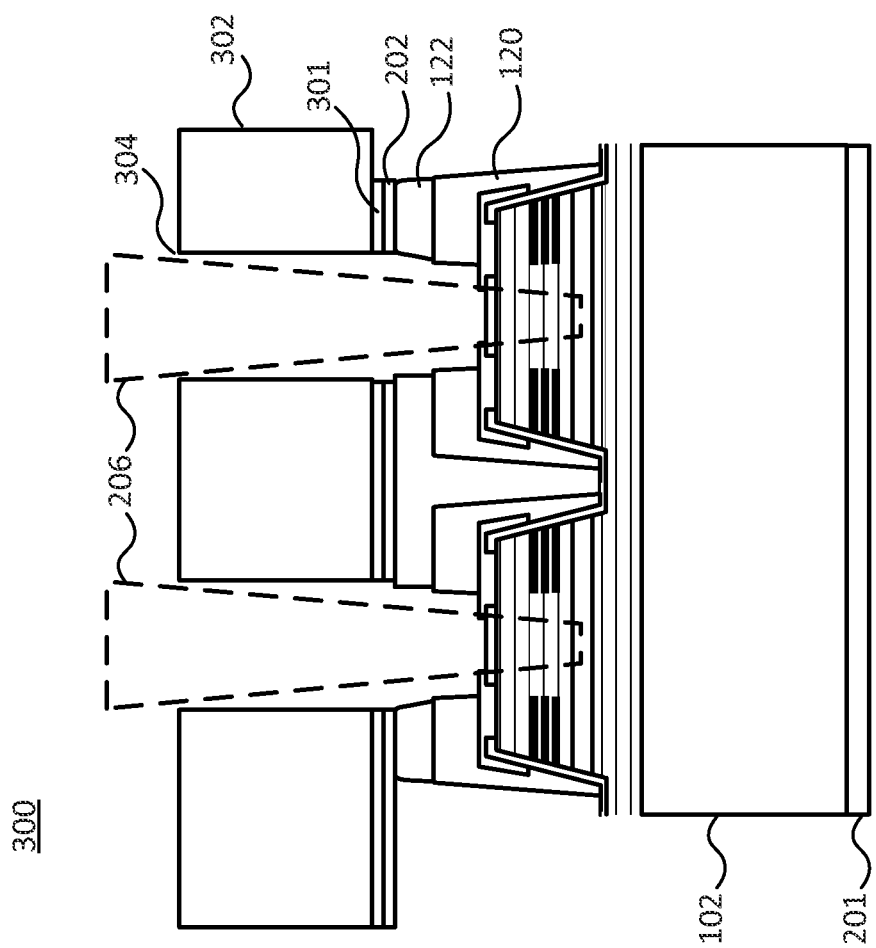
FIG. 3 is a simplified and greatly enlarged sectional view of a top emitting VCSEL array illustrating a different second group of several sequential steps in a method of fabricating a multibeam high power device in accordance with an embodiment.

FIG. 3 illustrates a different embodiment from FIG. 2. In FIG. 3, the VCSEL device 300 includes the two mesa structures 124 for the VCSEL device 100, with a dielectric layer 301 formed on top of the conductive pad 202 and then the heat spreading substrate or superstrate 302 formed thereover. Further, FIG. 2 illustrates the superstrate 302 with via holes 304 formed therein, such that the laser beams 206 propagating through the via holes 304 instead of through the material of the superstrate 204. The addition of the dielectric layer 301 between the electrical conductive pad 202 and the superstrate 302 serves to isolate the conductive elements 202 from the conductive superstrate 302.

FIG. 1B illustrates a variant of the VCSEL device 100 shown in FIG. 1A. In FIG. 1B, the first metal contact now refers to first metal contact 125, which is placed between the first or lower mirror 104 and the first region 106, and the metal contact 127 in contact with the second or upper mirror 112 is now referred to as the second metal contact 127. The substrate 102 also forms a substrate mesa 129 over which the first metal contact 125 is also formed. In addition, while the adhesion layer 122 could still be used, FIG. 1B does not show it, but rather shows the dielectric layer 131 placed above the mesa heat sink 120 so as to electrically isolate the mesa heat sink 120 from the heat spreading substrate 133, which is formed over the dielectric layer 131 and on top of the substrate mesa 129 so as to be in electrical contact with first metal contact 125. The substrate 133 could otherwise be formed in the same manner as the superstrates illustrated in FIGS. 2 and 3, with the light projected through the superstrate directly, or via holes being formed within the superstrate through which light projects.

FIG. 4 illustrates a top view of a VCSEL device 400 having a ground-signal-ground waveguide that includes heat spreading superstrate 402, conductive pad or signal pad 404, and a gap 406 between the signal pad 404 and the ground pads 408 and 410. Superstrate 402 lays on top of the device 400 and is in contact with the conductive pads 404, but is not illustrated as such in FIG. 4 so the elements below the superstrate 402 can be more readily viewed. In the partially broken close-up section 412, further details are illustrated, including conductive pad 404 and the aperture 416 of each VCSEL element as seen through the hole 418 in the superstrate 402. FIG. 4 also illustrates the adhesive layer 420, which is in contact with the heat sink structure of the underlying mesas (the mesas are not illustrated in FIG. 4. The close-up section 412 shows the aperture of the VCSEL 416 registered or aligned with the hole 418 in the element pads of the superstrate 402 and the area where the adhesive material 420 is bonding the superstrate element pads to the mesa heat sink structure. The ground-signal-ground waveguide has contact pads 404 separated between ground pads 408 and 410 by the gap 406.

Figure 5:
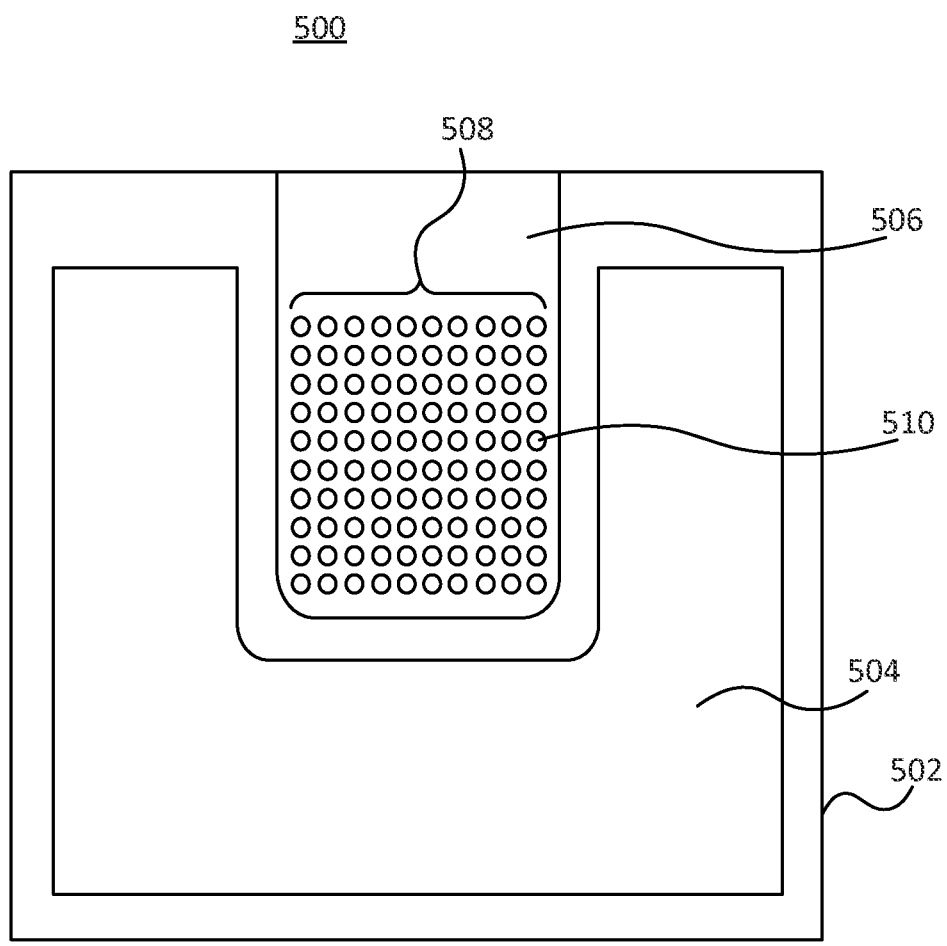
FIG. 5 is a top view of a pattern of elements formed on a superstrate in accordance with an embodiment.

FIG. 5 illustrates a top view of a VCSEL device 500 having a single element contact on a superstrate 502, with a ground pad 504, a conductive pad or signal pad 506, and the via holes 508 through the superstrate 502 to the element pad 510 underneath. As with FIG. 4, superstrate 502 lays on top of the device 500 and is in contact with the conductive pads 506, but is not illustrated as such in FIG. 5 so the elements below the superstrate 502 can be more readily viewed. As shown in FIG. 5, the holes 508 for laser emission are positioned substantially near the center of the chip.

Figure 6:
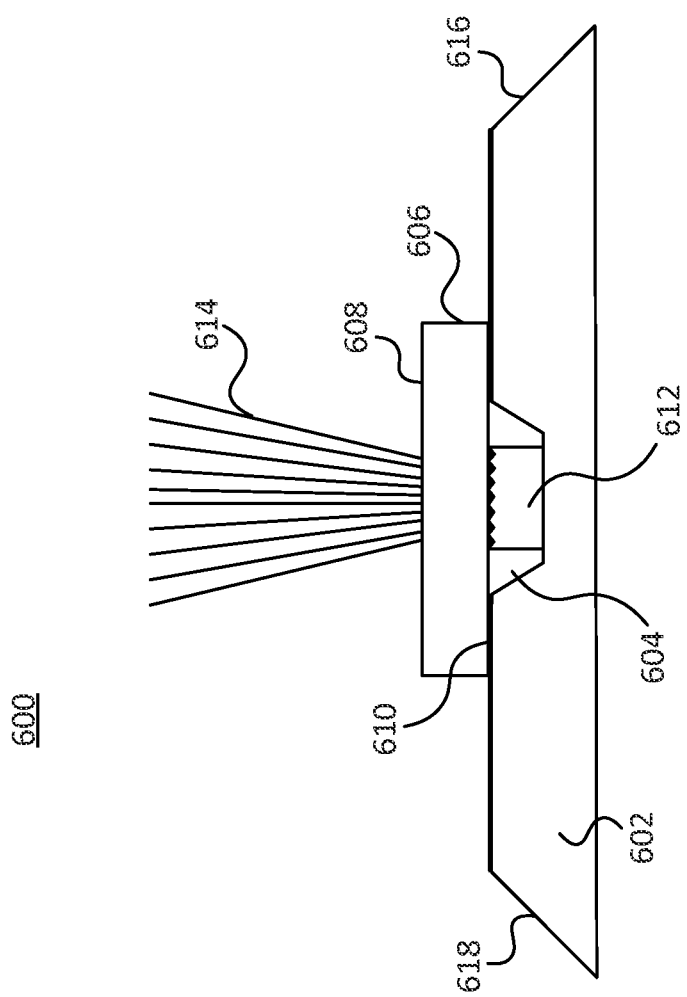
FIG. 6 is a sectional view of a submount with the laser array assembly bonded without the laser array assembly showing possible lead configurations.

FIG. 6 illustrates VCSEL device 600 comprising a submount 602, a submount cavity 604, and a conductive bond 606 on the surface 610 of the submount cavity that connects to the superstrate 608 and acts as a ground or negative lead to the VCSEL array chip 612. FIG. 6 also illustrates lead ramp 616 and lead ramp 618 etched into submount 602 and laser beams 614 propagating from the superstrate 608. The sectional view of FIG. 6 illustrates the VCSEL array chip 612 in the cavity 604 of the submount 602, with conductive adhesive bonding 606 under chip 612 contacting the cavity grounded conductive surface and a lead connected to that as the ground lead positioned from the top surface 610 to the ramp 616. As illustrated, the positive lead may be on ramp 618. In another embodiment the positive and negative contacts could be reversed.

Figure 7:
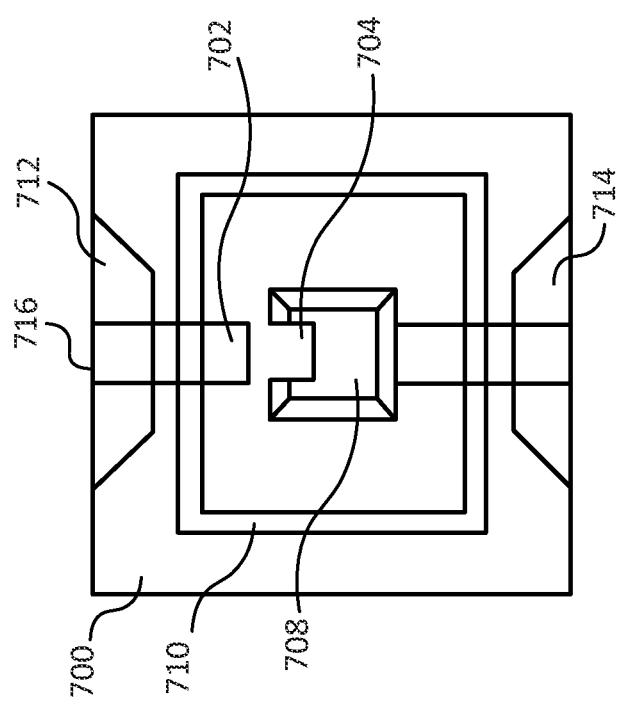
FIG. 7 is a top view of a submount without the laser array assembly showing possible lead configurations.

FIG. 7 illustrates a top view of a submount 700 without the VCSEL, assembly showing the positive lead 702, extending from the non-conductive area 704, and the negative lead 706, extending from the submount cavity conductive area 708, to the upper surface 710 of the submount 700. The positive lead 702 then runs down the etched 45 degree sloped positive sidewall 712 of the submount 700, while the negative lead 706 runs down the etched 45 degree sloped negative sidewall 714 of the submount 700. Both leads 702 and 706 are bonded at the respective edge 716 of the submount 700.

Figure 8:
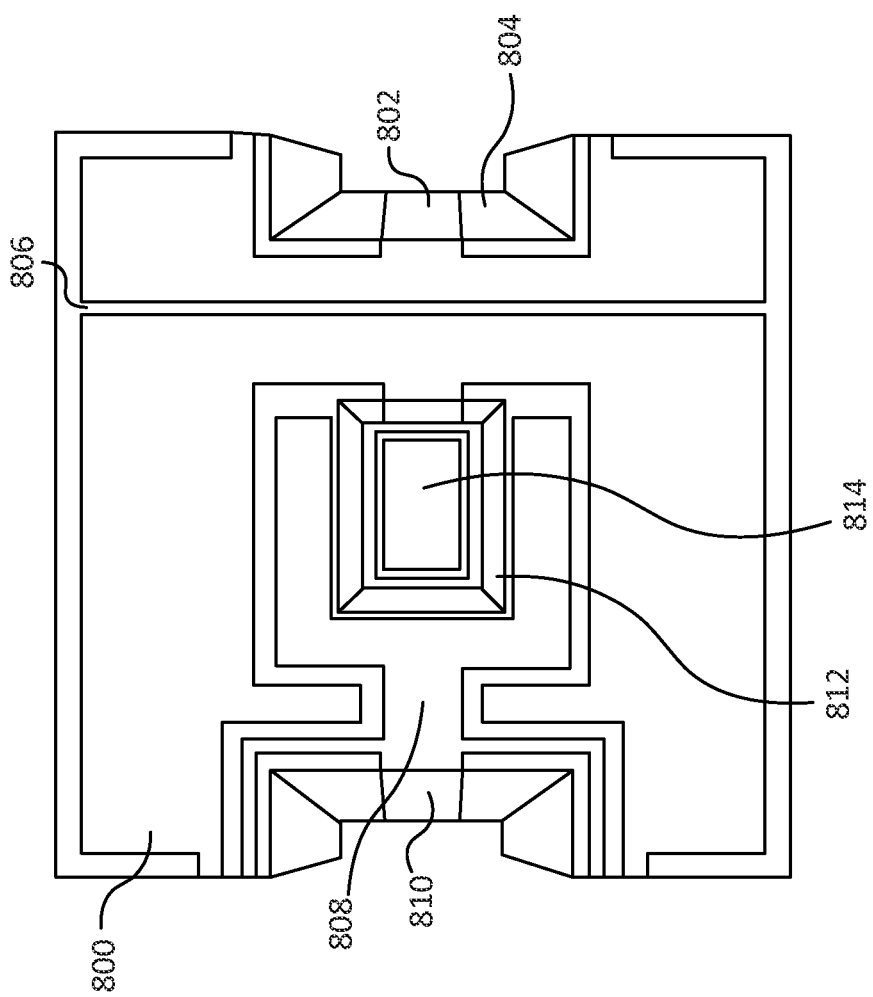
FIG. 8 is a top view of a package for a laser chip suitable for connection to or mounting on the surface of an electrical board.

FIG. 8 illustrates an embodiment of a mounting design with a negative or ground contact/pad 800 and a negative contact lead 802 that runs down the ramp 804 etched in Si crystal plane of the submount 806 to the surface of the board or leads to which the submount 806 will be mounted. The positive contact/pad 808 has a positive contact lead 810, which ramps down in the same manner. Plating contacts lead beyond the edge for ease of plating. The Si etch has formed an indent or pocket 812 for the laser chip 814 to set in, which can be electrical connected to the base by thermally and electrically conductive adhesives in the indent or pocket 812, which also is connected to the electrical pads 800 and 808 as appropriate. A lens holder (not shown) may also be electrically connected and adhesively connected to both electrical connects/pads 800 and 808 to complete the circuit for electrical operation. If the lens holder is removed the electrical connection may be broken.

In embodiments where such a submount is used, the metal contacts can be formed such as shown in FIG. 8, where the ground contact 800 may include an alignment pattern (not shown) for laser chip and optical element aligning and a positive contact 808. The submount is formed with the etched holes, noted above, where the crystal planes of the Si form the ramp 804 so that negative or ground contact 802 or positive contact 810 can make contact from the surface of the submount to the surface of a board, heatsink, contact, leads or any other surface to which the submount is attached and the electrical connections can be formed by simple conductive adhesive or solder to the ramped contacts mentioned above. Further, the openings in the submount provide protection for the delicate adhesive contacts and ramp metals. The contacts must be made robust by employing thick metal, typically using a plating process after the metal has been formed, but not necessarily, or any other metal process. In the case of plating, connecting leads to both the positive and negative or ground contacts can extend into the street where the die is separated so that the plating process is simplified.

The submount metal contacts on the surface which are ground or negative contact or the positive contact can be separated so that an interlock can be formed which prevents the laser from operating if the lens mount or optical element mount is removed, which has a conductible base in order to complete the contact to the laser from the connected surface leads or connections. This eye safety feature is important as the laser without the optical element could have enough power to be dangerous. Therefore, if the optical element and holder was removed, and the electrical connections were disconnected as a result, the array device would cease to function. The strength of the adhesive holding the optical element to the lens holder would need to be greater than the strength of the conductive base adhesive for this to be effective.

In another embodiment a single large hole or multiple holes in a thin metal superstrate could be used. Such a substrate would ease alignment to the laser array, and therefore reduce manufacturing costs. The substrate would be soldered or adhered to the top of the laser array from around the conductive rim (top metal) and also to the appropriate leads on the submount.

Figure 9:
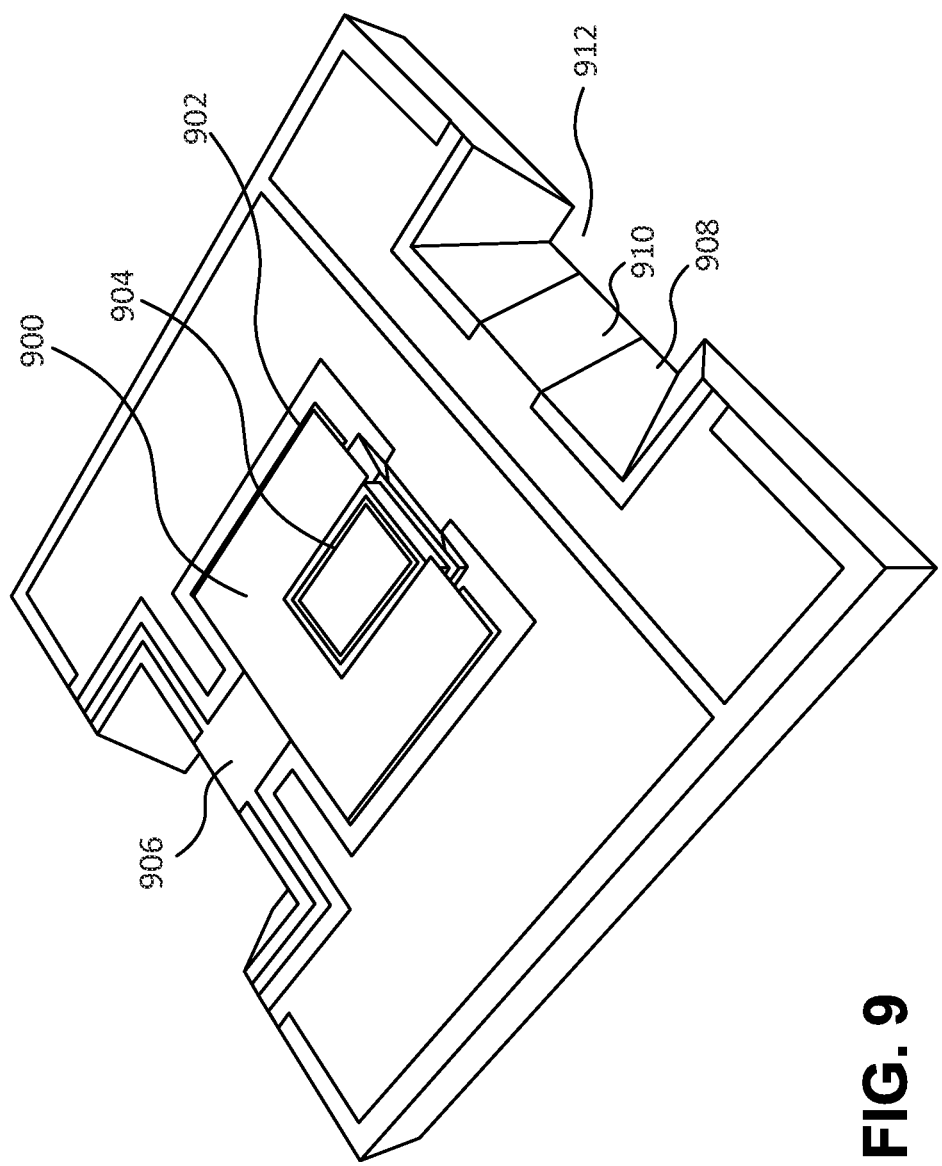
FIG. 9 is a perspective view of a package for a laser chip suitable for connection to or mounting on the surface of an electrical board.

FIG. 9 illustrates an embodiment of a mounting design that includes a thin metal superstrate 900 with a large U shaped opening that provides for an easier alignment. The superstrate may be grossly aligned and conductively adhered with adhesive layer 902 and electrically connected to the laser chip 904, around the edge of the chip 904, and with the positive contact 906. Further, the Si etched ramp 908 has the negative or ground lead 910 ramping down to the bottom of the submount for surface mountability. Opening 912 is formed on a wafer scale process allowing cost efficiency and protection for the leads and adhesives. After mounting and connecting of the chip 904 and superstrate 900, opening 912 can be backfilled for further protection.

In embodiments, the array device may be configured to use a submount and a superstrate which is formed as a conductive planar piece having a large U-shaped hole or opening formed therein, which allows ease of alignment to the laser die while providing an electrical contact from the plated top or first metal region of the laser die, which is not grounded to the electrical contact associated with it on the submount. The electrical contact with both surfaces can be made from conductive adhesive or solder. In such a configuration there would be no subgroups of arrays for separate contacts but only one positive electrical contact and one negative electrical contact.

Figure 10:
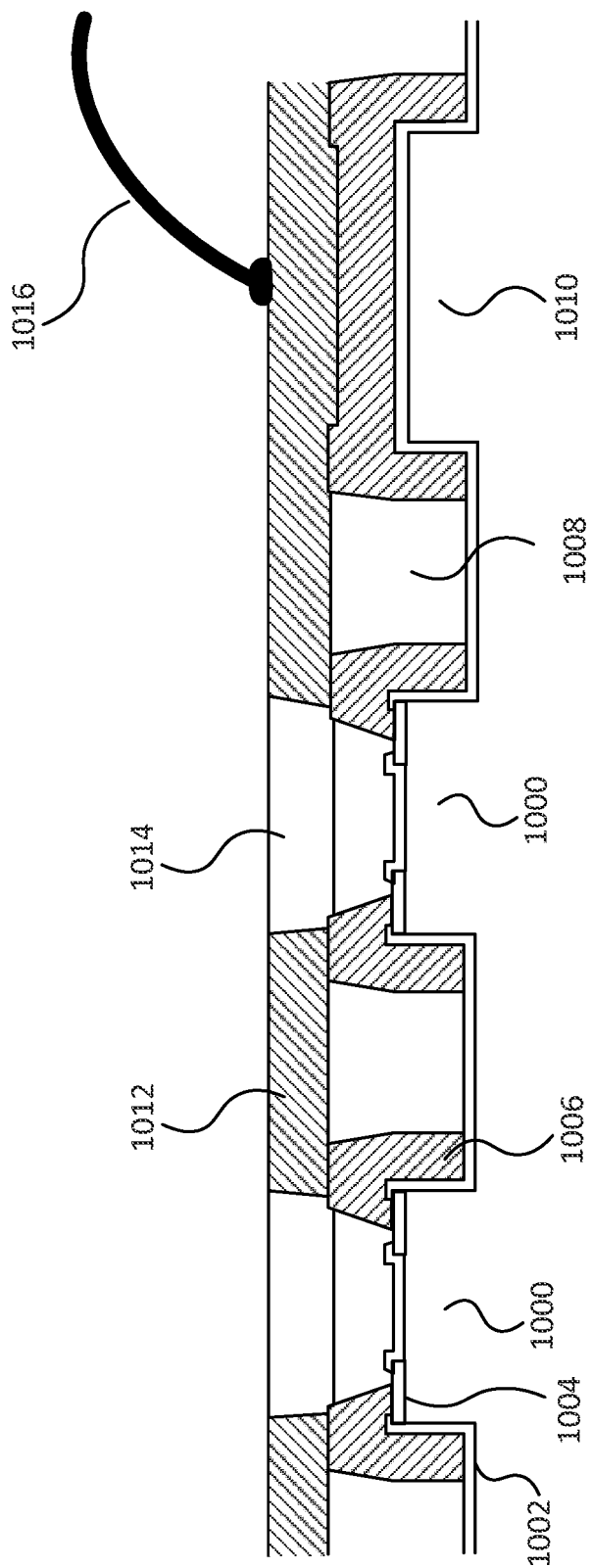
FIG. 10 is a sectional view of a laser array assembly showing mesas formed and covered with a dielectric layer which is opened to the ring or annular p contact formed on top of the mesa.

FIG. 10 is a sectional view of a laser array assembly showing mesas formed and covered with a dielectric layer which is opened to the ring or annular p contact formed on top of the mesa. In particular, the mesas 1000 are formed and partly covered with dielectric layer 1002, which is opened to the ring or annular p contact 1004 formed on top of the mesa 1000. The Plated heat sink 1006 is then formed around the mesa 1000 and contacted to the ring contact 1004 on the top of the mesa 1000. The polyimide or thick layer 1008 is then formed over the grounded substrate 1010. The electrical contact layer 1012 for connecting the elements together is formed with openings 1014 over the VCSEL apertures. A wire bond 1016 may connect the electrical contact to the electrical contact on the submount which is isolated from the ground contact.

Figure 11:
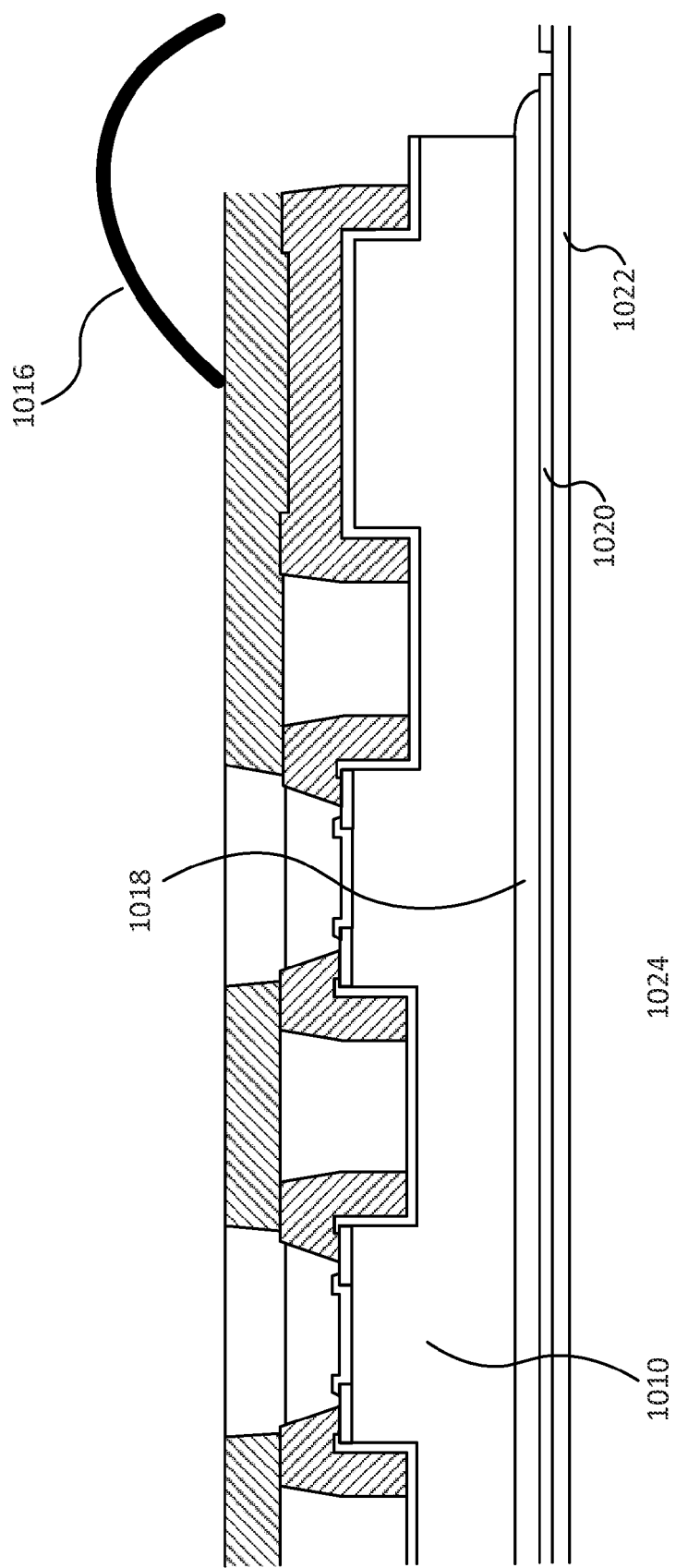
FIG. 11 is a sectional view the laser array assembly of FIG. 10 illustrating the substrate connected to a ground pad formed on an dielectric layer deposited over a heat sink substrate.

FIG. 11 is a sectional view the laser array assembly of FIG. 10 illustrating the substrate connected to a ground pad formed on an dielectric layer deposited over a heat sink substrate. As shown in FIG. 11, the grounded VCSEL substrate 1010 is soldered or electrically contacted 1018 to the ground pad 1020, which is formed on a dielectric layer 1022 deposited over the heat sink substrate 1024. The wire bond 1016 may then be electrically connected to a positive or signal pad (not shown).

A detailed description of an embodiment for fabricating the VCSEL arrays described above is now disclosed. The method of fabrication may use a number of common compound semiconductor processes known to those skilled in the art. For example, the epitaxial design and growth of the VCSEL wafer is only described herein in general terms because that process is known to those skilled in the art. Accordingly, a device may be fabricated from an epitaxially grown structure on a GaAs substrate. The device has two distributed Bragg reflectors with an active region and cladding layers between the two reflectors. The reflectors exhibit properties which enable an electrical contact to be fabricated to act as an electrical contact for the purpose of activating the device with constant current or an electrical signal produced by current pulses.

The fabrication of the devices may require an etch through the top reflector and through the active region in order to isolate the devices. The fabrication technique for this process is normally a plasma etch with an amount of Chlorine ($Cl_2$) gas in the plasma, or in a gas such as Boron Trichloride ($BCl_3$). Plasma etching is commonly achieved by applying an electrical potential between two conductive plates and reducing the pressure in a chamber which allows a plasma to form. The plasma exhibits corrosive qualities and the epitaxial layers will begin to etch away. An active monitoring system can be employed, such as a laser reflected off the surface, to display the depth of the etch by identifying each layer the etch passes through. A photo detector may be used to pick up the signal from the laser and display a periodic graph which identifies each layer as it passes through the varying refractive contrasts.

A layer in the epitaxial region of the top mirror may have a high content of Aluminum (Al), which, once exposed through the etch, can be subjected to an environment that oxidizes the Al to make $AlO_2$. $AlO_2$ is a non-conductive dielectric material and creates a collar that grows inward from the edge of the mesa to the interior. The growth of this layer may be controlled and stopped at a particular length that defines the current confinement region that is left in the middle of the mesa and has not been oxidized. High current densities flow through this region and are confined therein. As current flows through the active regions, band gaps between the materials allow photons to be created, which exhibit particular characteristics, such as the wavelength of the light to be generated.

The photons propagate through the reflectors and at each interface of the multiple interfaces of the reflectors, a small fraction of the light is reflected back perpendicular to the surface of the layer. Multiple layers of the mirror will reflect the majority of the light in this manner. The light is in phase due to the precise thickness of the layers. As this light reflects back and forth through the reflectors, the power of the laser builds up and at a desired power level the laser light eventually exits through an aperture that has been defined on the least reflecting mirror at the top of the mesa. The aperture may be formed in the middle of an annular ring fabricated through photolithographic means on top of the mesa and may consist of an ohmic metal contact matched to the properties of the conductive layer on the surface of the mirror. A top emitting design may require this annular contact in order to inject current while allowing light to be emitted from the aperture.

As previously noted, bottom emitting VCSEL designs are much more efficient at removing heat as the top of the mesa is an entire metal disk where heat sinking can occur directly from the entire surface of the top of the mesa. Once the devices are formed the substrate may be flipped upside down and bonded to a heat sink where the light emits through the least reflective mirror on the side of the substrate as it propagates through the substrate and exits. Thermal management of bottom emitting VCSELs is considerably more efficient than the top emitting designs. Existing top emitting designs manage heat generation by encompassing a mass around or on top of the mesa to remove the heat. Once the heat is in the mass, it must travel through the VCSEL substrate which is generally bonded at the bottom of the substrate. A problem arises with this design because the GaAs substrate has poor thermal conductance, thereby allowing heat to build up because the poor conduction does not allow the heat to fully escape the localized areas. As denser arrays generate more heat, top emitting VCSEL designs for dense arrays become even more problematic for effective thermal management. This seriously limits the device characteristics as the junction temperature rises and the efficiency of the device reduces or shuts down entirely. For this reason, top emitting designs of dense arrays are not found commercially. The present embodiment describes a design which allows heat generation and spreading in a much more efficient manner for top emitting devices.

Returning now to the fabrication process, the contacts and the aperture may have a dielectric coating deposited either before or after the oxidation process or the contact formation and via holes through the dielectric material may be easily made with photolithographic means. The dielectric material allows electrical isolation from coed surfaces in the epitaxial layers exposed by etching or on the surface of the mesa. In embodiments, a conductive mass structure may be formed encompassing the mesa with a via hole over each aperture so that light can still be emitted. The thickness, material, and dimensions of this layer can be widely varied. The process for forming such a mass may be a plating process that is known to those skilled in the art. Other deposition techniques may also be utilized.

This mass structure also forms a height dimension for the mesa which may be important and described at a later time. The conductive mass structure may have an adhesive layer deposited on the surface in order to bond to the electrically conductive associated pad that has been formed on the superstrate which may be positioned above the mesas. Holes in the electrical pad may be registered over the VCSEL apertures allowing light to be emitted through the superstrate. The superstrate material may have transmission qualities that are appropriate for the light propagation. An example of such a material could be diamond, or Silicon Carbide (SiC), which both exhibit a high thermal conduction and high light transmission. The electrical pads, which have been deposited on the superstrate material, may be formed in a number of designs. Either a single pad, which contacts the VCSEL elements of the army, may be formed, or multiple pads may be formed in groups for addressability of sections of the VCSEL array. These electrical pads or elements, with light emitting holes, may be formed in a ground-signal-ground waveguide configuration or a coplanar waveguide configuration. These elements may be in contact with the heat sink structures on the mesas enabling efficient thermal conduction to the superstrate that distributes the heat to a much larger mass and out through the package.

The contact pads or elements on the superstrate may generally be a metal deposited by means known to those skilled in the art. Adhesive layers can be initially deposited, such as titanium, before a thicker conductive layer is deposited, such as Gold, to form the elements. These elements on the superstrate have pads formed on the outside edge for bonding to the signals and carrying current injected through the VCSEL device. Generally, the positive potential is applied to these contacts and the negative potential is applied to the back surface of the VCSEL substrate.

In another embodiment, a semi-insulating substrate is used for the VCSEL substrate and the negative potential is contacted in a region in contact with the bottom mirror, allowing current injection to occur. The negative contact is formed by using a material and shorting a path to an electrical grounded pad on the superstrate. This structure can be formed by using a mesa with a metal deposition covering the entire structure, shorting it to the end contact, while the top of the structure may be electrically connected to a ground pad on the superstrate. Many of the fabrication methods and sequences can be substituted by similar methods and materials that are known to those skilled in the art.

A more detailed description of the fabrication of an embodiment is as follows:

Step 1. Use an epitaxially grown wafer as specified above which has a top mirror structure (112 in FIG. 1), and an active region composed of one or more quantum wells sandwiched between the appropriate cladding layers (108 in FIG. 1) and a bottom mirror (104 in FIG. 1) with slightly more reflectivity than the top mirror. Pattern said wafer or piece with a common photolithography step, such as a positive thick resist, where the considerations would be the mesa dimensions and the etch selectivity of the photo resist to the epitaxy material so that the resist had plenty of height left after said etch. Etch may be usually accomplished by means of a Cl based dry etch plasma using a Cl:$BCL_3$ mixture, but may be any number of gases or mixtures thereof. The etch may also be accomplished by many wet etchants. Other forms of etching such as ion milling or reactive ion beam etching or the like are possible, but may not be practical. The etch must be deep enough to isolate the active regions and stop either on the N mirror, an etch stop layer formed in the N mirror, or through the N mirror into the substrate. After etching the removal of the photoresist material must be performed by a wet solvent clean or dry $O_2$ etching or a combination of both.

Step 2. Oxidation of the high Al content layer or layers by timing the placement of the wafer or sample in an environment of heated $N_2$ bubbled through $H_2O$ and injected into a furnace generally over 400° C. may result in the current confinement regions (110 in FIG. 1). A photolithographic step to define an ion implant area for current confinement may also be used or a combination of both techniques.

Step 3. Deposition of a dielectric material (114 in FIG. 1) over the entire surface is usually accomplished by PECVD (plasma enhanced chemical vapor deposition), but other techniques, such as ALD (atomic layer deposition), may be used. The objective is to create a sufficiently thick conformal coating over the surface and the mesa sidewalls that current leakage through pinholes from subsequent metal layers is minimized or prevented. The other properties to consider while choosing the thickness of this film include the capacitance of the plated metal heat sink to the substrate ground where the dielectric layer would be more beneficial to be thicker. However, given that the dielectric layer on the sidewall may need to transfer heat from the active region to the heat sink, a thinner layer may be more beneficial. Multiple depositions to accomplish both properties with different deposition techniques may be used. An example of this technique would be, after a deposition of PECVD SiNx, E-beam deposition of SiNx, or another dielectric could be deposited which has a more directional deposition rate putting thicker dielectric material on the incident surfaces.

Step 4. A photolithographic process is used to define the openings in the dielectric where an annular ring contact is to be made to the top mirror contact layer (118 in FIG. 1). The N contact may be accessed through the VCSEL substrate, but in other embodiments may also be formed by openings in the dielectric over N contact metal areas in contact with the substrate, but accessible to the top of the Substrate or etched areas. These areas are over the N-substrate or a highly conductive layer in contact with the N substrate so that the N metal layer can make contact to the substrate potential either through the N mirror, an etch stop and contact layer which is generally heavily doped, or to the substrate itself. After this photolithographic process, an etch of the dielectric material is performed to remove all dielectric material from those areas left open in the photo resist. This etch can either be a dry etch by RIE (reactive ion etch), commonly using a Fl based gas or combination of others gases, or a wet etch using chemicals such as a dilute HF acid, BOE, or another reactant chosen for the composition of the dielectric material used. It may also be necessary to over etch this area to ensure all dielectric material is removed, as any left can cause poor electrical contacts for the subsequent metal layers deposited.

Step 5. A photolithographic process may be used to define the openings over the top mirrors where the dielectric was opened in the above step. This area may be an annular ring forming a disk of dielectric left in the middle of the ring for light emission. The contact that is formed is also in contact with the heat sink material which is plated at a later step or any area between the 2 constraints. Generally a common liftoff technique may be chosen for this photolithographic process so that the metal deposited on the surface can easily be removed from the areas of the surface covered with photo resist. The P-metal contact layer may be a multilayer deposition and deposited by E-beam, resistive evaporation, sputter or any other metal deposition techniques. A thin Ti layer ~200 A may first be deposited for adhesion of the next layer. The thickness of this layer may vary greatly but may generally be chosen to be between approximately 50 A and 400 A as the Ti films are stressful and more resistive than the subsequent layers. Other adhesive metal layers can be substituted for this layer such as Cr, Pd, Ni or the like. Also this layer could serve as a reflector layer to increase reflectance of the contacting mirror. The next layer may be deposited directly on top of this layer without breaking vacuum. In many cases, a diffusion barrier layer may be deposited next as a guard against the Au or top metals diffusing too far into the contact because of excessive heating at the bonding stage. Metals chosen are generally Pd, Pt, Ni, W or other metals or combinations of metals chosen for this purpose. The thickness chosen should depend upon specific bonding temperatures needed in the flip chip process. The next layer is generally Au, but can be Pd or Pt or other mixtures, such as AuBe or AuZn. The thickness of approximately 2000 A may be typical for this layer, but could generally have a wide range of thicknesses depending on the photo resist properties and heating characteristics of the deposition. Another metal may also be deposited at this time to increase metal thickness and to form the metal heat sink at this stage thereby reducing the number of processing steps, which could be beneficial at this stage.

Step 6. A photolithographic process may be used to define the openings over the substrate and shorted N contact mesas where the dielectric was opened in step 4, if this N contact method is used in the design. The area corresponding to the N metal deposition should be slightly larger than the opening in the dielectric openings for the N metal. Generally, a common liftoff technique may be chosen for this photolithographic process so that the metal deposited on the surface can easily be removed from the areas of the surface covered with photo resist. The N-metal contact layer may be a multilayer deposition and deposited by E-beam, resistive evaporation, sputter or any other metal deposition techniques. The metal layers could be chosen such as Ni/Ge/Au, Ge/Au/Ni/Au, or many such combinations where the first layer or layers is deposited to reduce contact resistance by diffusion into the N-doped epitaxial material or the substrate or the first layer of the multi-layer metal stack can also be chosen as a diffusion limiting layer such as Ni so that in the annealing process the metals do not "clump" and separate due to the various diffusion properties of the materials. Evenly distributing diffusion of these metals is desired and can lower the contact resistance which also reduces heating. The thickness of this multi-layer metal stack may vary greatly. Embodiment may have a Ni/Ge/Au deposit of approximately 400 A/280 A/2000 A. In many cases a diffusion barrier layer may be deposited next as a guard against the Au or top metals from contact damage because of excessive heating at the bonding stage. Metals chosen may generally be Pd, Pt, Ni, W, or other metals chosen for this purpose. The thickness chosen should depend upon specific bonding temperatures needed in the flip chip process. The final layer may not be a metal which oxidizes as subsequent metals will need to adhere to the surface.

Step 7. A Rapid Thermal Anneal (RTA) step may be performed on the wafer which lowers contact resistance. The temperature may be rapidly ramped up to ~400° C., held for 30 seconds, and ramped down to room temperature. The peak temperature can vary and tests should be performed for the best temperature selection by means of a possible DOE (design of experiment) to achieve the lowest contact resistances of the active devices. This step my be performed at a later stage, but is generally done before solder is placed on to reduce oxidation of the solder or adhesive metal.

Step 8. A metal seed layer may be deposited. A thick photolithographic process may be used to define the openings over the mesas, but with resist left to define and protect the aperture. The shorted N contact mesas (if used in the design), where the heat sink structures will be plated or built up, can also be patterned at this time. A thick photoresist may usually be used for this step. These areas which are opened for plating will be over and around all mesas except the apertures. The metal seed layer may usually be a multilayer deposition and deposited by E-beam, resistive evaporation, sputter or any other metal deposition techniques. The metal layers could be chosen such as Ti/Au, at approximately 20 A/600 A thickness, or many such combinations, where the first layer or layers are deposited for adhesion and ease to etch off and the second layer/layers for conductivity and ease to etch off. The seed layer is continuous over the surface allowing electrical connections for plating, if this technique is used for building up the heat sinks.

Step 9. A thick metal mesa heat sink (120 in FIG. 1) may be deposited usually by plating, but could be by other means of deposition, in which case Step 8 would not be necessary. For plating, a photolithographic process may be used to define the openings over the openings just defined with the previous seed layer resist. The photo resist may be cleared out in the areas where the deposition will occur. The thickness of the photo resist may be chosen so that it will lift off easily after the thick metal is defined. A plasma clean using $O_2$ or combination with $O_2$ may be performed to clear any of the resist left on the gold seed layer. The metal may be plated next by a standard plating procedure. In an embodiment, Cu was chosen as the metal for plating due to the thermal conductance properties of Cu, but other metals could be used and should be considered. Some metal interfaces may cause reliability issues that need to be considered when this step is used to produce a production device. Plating thicknesses can vary, but in an embodiment an approximately 3 um thicknesses was chosen. Next, the wafer or sample may be placed in a solder plating solution such as In plating to create an adhesion layer (122 in FIG. 1). Other metals can be chosen at this step for their bonding characteristics. The thickness of the adhesion layer can vary greatly. In an embodiment, manufactured devices had approximately 2 um of plated in deposited on the heat sinks. Plating does not have to be the method for this deposition and sputtering or jet deposition may also be an alternative for solders such as AuSn alloys. After metal deposition is complete, the photo resist may then be rinsed away in solvents or plasma cleaned or a combination of both and the seed layer may be etched with a dry or wet etch that etches Au, then etched in a dry or wet etch that etches Ti and/or removes $TiO_2$. If using a wet etch for this step, over etching may cause damage to the dielectrics. The seed layer photoresist may then be cleaned off with standard resist cleaning methods. The VCSEL array substrate is now complete and ready for bonding.

Step 10. A metal may be defined as a conductive pad (202 in FIG. 2) and deposited on the heat spreading or heat reducing superstrate. The metal may be made of a thermally conductive material that also exhibits high transmission at the appropriate wavelength. This may be accomplished by a photolithographic process which is used to define the openings over the substrate including the openings (418 in FIG. 4), which may be registered to the VCSEL apertures in the bonding process. Generally, a common liftoff technique may be chosen for this photolithographic process so that the metal deposited on the surface can easily be removed from the areas of the surface covered with photoresist. The metal layer may then be deposited with any method. The photoresist may be cleaned off by any standard resist cleaning technique. The heat spreader or heat reducing superstrate is now ready for bonding.

Step 11. A flip chip bonding may be performed on the two substrates with the heat spreader superstrate on the bottom. This process my be accomplished by a machine that aligns the two substrates together, then places them in contact with each other and heats one or both substrates either before or after contacting said substrates. For a demonstration device, the bottom substrate was heated to approximately 270° C. and held at that temperature for approximately 2 min. An approximately 15 gram weight may be used on the downward substrate position. The device is left to cool to room temperature and is thereby completed.

Switching the order of some of the previous steps may be possible, such as the order of the metal depositions or by depositing the N metal or the like or even the P metal before the oxidation step, or switching the order of these layers after the oxidation, or to deposit them before the dielectric depositions. It is also possible to replace the top mirror structure with a dielectric DBR stack, or replace the mirror stacks either entirely or partially be processing a grating on the top of the mesa.

The top emitting VCSEL array assembly described and manufactured according to the processes described above has the unique property of leads on the underside of the superstrate with the laser apertures emitting up through the superstrate. This property may be used in a submount configuration. This submount configuration does not have to be used with the top emitting VCSEL array, but can also have other uses, such as a wafer scale packaging assembly process for many other forms of chips. Such embodiments include etching down a cavity for the chip, in this case the VCSEL array chip, which is bonded to the superstrate and positioned in the cavity with the base of the cavity being just slightly larger than the base of the VCSEL substrate, and the appropriate depth to just deeper than the height of the VCSEL chip, thereby allowing a small amount of room for an adhesive or conductive adhesive, like silver epoxy which also could be chosen for thermal conductance values. The cavity may be etched many ways, but in an embodiment is etched by a deep Si etch plasma process allowing steeper sidewalls than a KOH wet etch. The cavity and the lead cavities may both be defined by photolithographic means for the etch process. The lead cavities may be etched with KOH leaving approximately a ~47° wall profile, which is convenient for the leads to transfer the connections from the top of the wafer to the bottom of the sides, enabling ease of connecting to a surface mount pattern.

Metal leads may be formed on the surface by lithography or by a deep profile shadow mask allowing metal depositions to transfer down the topology of the etch profile (as shown in FIG. 6). Layers of dielectric, metal, or solders for bonding purposes maybe patterned over the leads where a dielectric layer would be first deposited over the leads and patterned, then metal and solder would be deposited for the bonding process with other components, such as a spacer or lid. The superstrate with the VCSEL attached may be bonded by means of an appropriate solder which in this case may be an AuSn deposited by thermal evaporation or the jet deposition process. Once the superstrate has been aligned to the lead pattern and is bonded, an epoxy or other filler can be used as a sealant or to make the chip bond more robust.

A number of possible embodiments are described below in further detail. In an embodiment, a top emitting VCSEL array device comprises a grounded substrate; one or more grounding pads electrically connected to the grounded substrate; and a plurality of VCSEL devices, each VCSEL device among the plurality of VCSEL devices configured to include a mesa on top of the grounded substrate, each mesa being configured to include a lower mirror formed on top of and in contact with the grounded substrate, a first region formed on top of and in contact with the lower mirror, an upper mirror, and an active region configured to generate light positioned between the first region and the upper mirror, each VCSEL device further including a first metal contact pad formed over at least a portion of and in electrical contact with the upper mirror, an aperture formed on the upper mirror to emit the light generated by the active region, a mesa heat sink structure formed over at least a portion of the first metal contact pad and configured to increase a mass of the mesa, a conductive pad formed above and in electrical contact with at least a portion of the heat sink structure, a dielectric layer formed over the conductive pad, and a heat spreading substrate placed over the dielectric layer and electrically isolated from but in thermal contact with the conductive pad.

In the embodiment, wherein the conductive pad for two or more VCSEL devices are formed together to form a first element, wherein the VCSEL array includes a plurality of first elements and each first element among the plurality of first elements is configured to be electrically isolated from any other first element.

In the embodiment, wherein the conductive pad for each of the VCSEL devices are formed together to form a first element.

In the embodiment, wherein the heat spreading substrate is formed over the dielectric layer, further comprising a lens array patterned on an outwardly facing side of the heat spreading substrate, wherein each lens of the lens array is registered with the aperture of a single VCSEL device.

In the embodiment, wherein the heat spreading substrate is formed over the dielectric layer, further comprising a plurality of via holes through the heat spreading substrate, wherein each via hole is registered with the aperture of a single VCSEL device.

In the embodiment, wherein each conductive pad is electrically isolated from any other conductive pad in a ground-signal-ground waveguide configuration where each of the one or more grounding pads are commonly connected.

In the embodiment, wherein the heat spreading substrate is soldered or adhered over the VCSEL array, the heat spreading substrate having either a single large hole or multiple holes formed therein for emitting light generated from the plurality of VCSEL devices to simplify alignment of the hole/holes with the apertures of the plurality of VCSEL devices and to reduce a cost of manufacturing the VCSEL array.

In the embodiment, further comprising a diffractive optical element through which the light generated by the active region is propagated to produce multiple beams of light in a pattern of diverging beams for structured fight applications.

In the embodiment, wherein the array device is configured to be used in a time of flight (TOE) imaging application.

In the embodiment, wherein the array device is configured to be used as a near infrared (NIR) illumination source for imaging applications.

In the embodiment, wherein the array device is configured to be used as a motion detection or a NIR illumination source for security applications.

In the embodiment, wherein the array device is configured to be used as a laser source for lidar or ladar applications.

In the embodiment, wherein the array device is configured to be used as a laser source for a projection illumination source.

In the embodiment, wherein the array device is configured to be used in a communication application for data transfer.

In the embodiment, wherein the array device is configured to be used in a materials processing application for burning, cutting or ablating material.

In the embodiment, wherein the array device is configured to be used in a medical application for burning, cutting or ablating material.

In the embodiment, wherein the array device is configured to be used in a medical application for Near Field Imaging.

In the embodiment, wherein the array device is configured to be used in a Near Field Communication application.

In the embodiment, wherein the array device is configured to be used in a satellite communication application for data transfer.

In the embodiment, wherein the array device is configured to be used in a high power defense application.

In the embodiment, wherein the array device is configured to be used in a high power density application for an energy producing application.

In the embodiment, wherein the array device is configured to be used in a high power density solid state pumping application or a diode pumped solid state crystal application.

In the embodiment, wherein the array device is configured to be used in a high power density solid state pumping application or a diode pumped solid state crystal application where the heat spreading substrate is a crystal capable of solid state pumping where the VCSEL array pumps a solid state crystal to produce a single high power beam.

In the embodiment, further comprising a submount with a cavity for placement of the plurality of VCSEL devices, wherein the cavity is conductive and in contact with the VCSEL device, the submount including an etched ramp and a positive electrical contact and a negative electrical contact formed on the submount that traverse from the cavity to an edge of the submount over the etched ramp.

In the embodiment, further comprising a submount for placement of the plurality of VCSEL devices, wherein the heat spreading substrate is a conductive planar piece having an opening formed therein for alignment of the VCSEL devices and providing an electrical contact for the conductive pad.

In an embodiment, a top emitting VCSEL array device comprises a semi-insulating substrate; and a plurality of VCSEL devices, each VCSEL device among the plurality of VCSEL devices configured to include a mesa on top of the semi-insulating substrate, each mesa being configured to include a lower mirror formed on top of and in contact with the semi-insulating substrate, a first electrical contact formed on top of and in contact with the lower mirror, a first region formed on top of and in contact with the first electrical contact, an active region formed above the first region and configured to generate light, an upper mirror formed above and in electrical contact with the active region, the upper mirror in electrical contact with a second electrical contact, and a aperture region formed on the upper mirror to emit the light generated by the active region, each VCSEL device further including a mesa heat sink structure formed over the mesa and configured to increase a mass of the mesa, each mesa heat sink structure configured to be in electrical contact with a first element, each first element configured to be electrically isolated from any other first element and electrically isolated from but thermally connected to a heat spreading substrate placed over each first element and a distance from the semi-insulating substrate, the semi-insulating substrate including a substrate mesa in electrical contact with the first electrical contact and configured to be in contact with a second element, the second element being in electrical contact and thermal contact with the heat spreading substrate.

In the embodiment, wherein the first element is singular structure configured to be electrically connected to each mesa heat sink structure and configured to be electrically isolated from the second element.

In the embodiment, further comprising a dielectric layer formed over the mesa heat sink structure, wherein the heat spreading substrate is formed over the dielectric layer; and a lens array patterned on an outwardly facing side of the heat spreading substrate, wherein each lens of the lens array is registered with the aperture of a single VCSEL device.

In the embodiment, further comprising: a dielectric layer formed over the mesa heat sink structure, wherein the heat spreading substrate is formed over the dielectric layer; and a plurality of via holes formed through the heat spreading substrate, wherein each via hole is registered with the aperture of a single VCSEL device.

In the embodiment, further comprising a plurality of grounding pads connected to the substrate mesa, wherein each first element is configured as a separate electrically isolated element in a ground in a ground-signal-ground waveguide configuration.

In the embodiment, wherein the heat spreading substrate is soldered or adhered over the VCSEL array, the heat spreading substrate having either a single large hole or multiple holes formed therein for emitting light generated from the plurality of VCSEL devices to simplify alignment of the hole/holes with the apertures of the plurality of VCSEL devices and to reduce a cost of manufacturing the VCSEL array.

In an embodiment, a method of manufacturing a VCSEL, army device comprising the steps of forming a grounded substrate; and forming two or more VCSEL devices, each VCSEL device among the two or more VCSEL devices including a first mesa formed on top of the grounded substrate, each first mesa including a lower mirror in contact with the ground substrate and a first region in contact with the lower mirror, each first mesa further including an upper mirror, an active region configured to generate light and positioned between the lower mirror and the first region, a first metal contact pad configured to be in electrical contact with the upper mirror, and an aperture configured for light emission on the upper mirror, each VCSEL device further including a plurality of metal heat sink structures deposited over each first mesa and configured to increase the mass of each first mesa, each heat sink structure in electrical contact with an electrical pad connected singly or in parallel with two or more VCSEL devices in the VCSEL array device and configured to form a plurality of first elements, each first element configured to be electrically isolated from any other first element, configured to be electrically connected to a heat spreading substrate, configured to be electrically connected to a positive sub-mount contact, and configured to be in contact with the heat spreading substrate, the heat spreading substrate positioned at a distance from the grounded substrate.

The methodologies described herein may be implemented by various methods, depending upon applications according to particular examples. For example, such methodologies may be implemented in hardware, firmware, software, or combinations thereof. In a hardware implementation, for example, a processing unit may be implemented within one or more application specific integrated circuits ("ASICs"), digital signal processors ("DSPs"), digital signal processing devices ("DSPDs"), programmable logic devices ("PLDs"), field programmable gate arrays ("FPGAs"), processors, controllers, micro-controllers, microprocessors, electronic devices, other devices units designed to perform the functions described herein, or combinations thereof.

Some portions of the detailed description included herein may be presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Reference throughout this specification to "one example," "an example," and/or "another example" should be considered to mean that the particular features, structures, or characteristics may be combined in one or more examples.

While there has been illustrated and described what are presently considered to be example features, it will be understood by those skilled in the art that various other modifications may be made, and equivalents may be substituted, without departing from the disclosed subject matter. Additionally, many modifications may be made to adapt a particular situation to the teachings of the disclosed subject matter without departing from the central concept described herein. Therefore, it is intended that the disclosed subject matter not be limited to the particular examples disclosed.

What is claimed:

1. A top emitting VCSEL array device, comprising:
   a grounded substrate;
   one or more grounding pads electrically connected to the grounded substrate; and
   a plurality of VCSEL devices, each VCSEL device among the plurality of VCSEL devices configured to include a mesa on top of the grounded substrate, each mesa being configured to include a lower mirror formed on top of and in contact with the grounded substrate, a first region formed on top of and in contact with the lower mirror, an upper mirror, and an active region configured to generate light positioned between the first region and the upper mirror, each VCSEL device further including a first metal contact pad formed over at least a portion of and in electrical contact with the upper mirror, an aperture formed on the upper mirror to emit the light generated by the active region, a mesa heat sink structure formed over at least a portion of the first metal contact pad and configured to increase a mass of the mesa, a conductive pad formed above and in electrical contact with at least a portion of the heat sink structure, a dielectric layer formed over the conductive pad, and a heat spreading substrate placed over the dielectric layer and electrically isolated from but in thermal contact with the conductive pad.

2. The array device as recited in claim 1, wherein the conductive pad for two or more VCSEL devices are formed together to form a first element, wherein the VCSEL array includes a plurality of first elements and each first element among the plurality of first elements is configured to be electrically isolated from any other first element.

3. The array device as recited in claim 1, wherein the conductive pad for each of the VCSEL devices are formed together to form a first element.

4. The array device as recited in claim 1, wherein the heat spreading substrate is formed over the dielectric layer, further comprising a lens array patterned on an outwardly facing side of the heat spreading substrate, wherein each lens of the lens array is registered with the aperture of a single VCSEL device.

5. The array device as recited in claim 1, wherein the heat spreading substrate is formed over the dielectric layer, further comprising a plurality of via holes through the heat spreading substrate, wherein each via hole is registered with the aperture of a single VCSEL device.

6. The array device as recited in claim 1, wherein each conductive pad is electrically isolated from any other conductive pad in a ground-signal-ground waveguide configuration where each of the one or more grounding pads are commonly connected.

7. The array device as recited in claim 1, wherein the heat spreading substrate is soldered or adhered over the VCSEL array, the heat spreading substrate having either a single large hole or multiple holes formed therein for emitting light generated from the plurality of VCSEL devices to simplify alignment of the hole/holes with the apertures of the plurality of VCSEL devices and to reduce a cost of manufacturing the VCSEL array.

8. The array device as recited in claim 1, further comprising a diffractive optical element through which the light generated by the active region is propagated to produce multiple beams of light in a pattern of diverging beams for structured light applications.

9. The array device as recited in claim 1, wherein the array device is configured to be used in a time of flight (TOF) imaging application.

10. The array device as recited in claim 1, wherein the array device is configured to be used as a near infrared (NIR) illumination source for imaging applications.

11. The array device as recited in claim 1, wherein the array device is configured to be used as a motion detection or a NIR illumination source for security applications.

12. The array device as recited in claim 1, wherein the array device is configured to be used as a laser source for lidar or ladar applications.

13. The array device as recited in claim 1, wherein the array device is configured to be used as a laser source for a projection illumination source.

14. The array device as recited in claim 1, wherein the array device is configured to be used in a communication application for data transfer.

15. The array device as recited in claim 1, wherein the array device is configured to be used in a materials processing application for burning, cutting or ablating material.

16. The array device as recited in claim 1, wherein the array device is configured to be used in a medical application for burning, cutting or ablating material.

17. The array device as recited in claim 1, wherein the array device is configured to be used in a medical application for Near Field Imaging.

18. The array device as recited in claim 1, wherein the array device is configured to be used in a Near Field Communication application.

19. The array device as recited in claim 1, wherein the array device is configured to be used in a satellite communication application for data transfer.

20. The array device as recited in claim 1, wherein the array device is configured to be used in a high power defense application.

21. The array device as recited in claim 1, wherein the array device is configured to be used in a high power density application for an energy producing application.

22. The array device as recited in claim 1, wherein the array device is configured to be used in a high power density solid state pumping application or a diode pumped solid state crystal application.

23. The array device as recited in claim 1, wherein the array device is configured to be used in a high power density solid state pumping application or a diode pumped solid state crystal application where the heat spreading substrate is a crystal capable of solid state pumping where the VCSEL array pumps a solid state crystal to produce a single high power beam.

24. The array device as recited in claim 1, further comprising a submount with a cavity for placement of the plurality of VCSEL devices, wherein the cavity is conductive and in contact with the VCSEL device, the submount including an etched ramp and a positive electrical contact and a negative electrical contact formed on the submount that traverse from the cavity to an edge of the submount over the etched ramp.

25. The array device as recited in claim 1, further comprising a submount for placement of the plurality of VCSEL devices, wherein the heat spreading substrate is a conductive planar piece having an opening formed therein for alignment of the VCSEL devices and providing an electrical contact for the conductive pad.

26. A top emitting VCSEL array device, comprising:
a semi-insulating substrate; and
a plurality of VCSEL devices, each VCSEL device among the plurality of VCSEL devices configured to include a mesa on top of the semi-insulating substrate, each mesa being configured to include a lower mirror formed on top of and in contact with the semi-insulating substrate, a first electrical contact formed on top of and in contact with the lower mirror, a first region formed on top of and in contact with the first electrical contact, an active region formed above the first region and configured to generate light, an upper mirror formed above and in electrical contact with the active region, the upper mirror in electrical contact with a second electrical contact, and a aperture region formed on the upper mirror to emit the light generated by the active region, each VCSEL device further including a mesa heat sink structure formed over the mesa and configured to increase a mass of the mesa, each mesa heat sink structure configured to be in electrical contact with a first element, each first element configured to be electrically isolated from any other first element and electrically isolated from but thermally connected to a heat spreading substrate placed over each first element and a distance from the semi-insulating substrate, the semi-insulating substrate including a substrate mesa in electrical contact with the first electrical contact and configured to be in contact with a second element, the second element being in electrical contact and thermal contact with the heat spreading substrate.

27. The array device as recited in claim 26, wherein the first element is singular structure configured to be electrically connected to each mesa heat sink structure and configured to be electrically isolated from the second element.

28. The array device as recited in claim 26, further comprising:
a dielectric layer formed over the mesa heat sink structure, wherein the heat spreading substrate is formed over the dielectric layer; and
a lens array patterned on an outwardly facing side of the heat spreading substrate, wherein each lens of the lens array is registered with the aperture of a single VCSEL device.

29. The array device as recited in claim 26, further comprising:
a dielectric layer formed over the mesa heat sink structure, wherein the heat spreading substrate is formed over the dielectric layer; and
a plurality of via holes formed through the heat spreading substrate, wherein each via hole is registered with the aperture of a single VCSEL device.

30. The array device as recited in claim 26, further comprising a plurality of grounding pads connected to the substrate mesa, wherein each first element is configured as a separate electrically isolated element in a ground in a ground-signal-ground waveguide configuration.

31. The array device as recited in claim 26, wherein the heat spreading substrate is soldered or adhered over the VCSEL array, the heat spreading substrate having either a single large hole or multiple holes formed therein for emitting light generated from the plurality of VCSEL devices to simplify alignment of the hole/holes with the apertures of the plurality of VCSEL devices and to reduce a cost of manufacturing the VCSEL array.

32. A method of manufacturing a VCSEL array device comprising the steps of:
forming a grounded substrate; and
forming two or more VCSEL devices, each VCSEL device among the two or more VCSEL devices including a first mesa formed on top of the grounded substrate, each first mesa including a lower mirror in contact with the ground substrate and a first region in contact with the lower mirror, each first mesa further including an upper mirror, an active region configured to generate light and positioned between the lower mirror and the first region, a first metal contact pad configured to be in electrical contact with the upper mirror, and an aperture configured for light emission on the upper mirror, each VCSEL device further including a plurality of metal heat sink structures deposited over each first mesa and configured to increase the mass of each first mesa, each heat sink structure in electrical contact with an electrical pad connected singly or in parallel with two or more VCSEL devices in the VCSEL array device and configured to form a plurality of first elements, each first element configured to be electrically isolated from any other first element, configured to be electrically connected to a heat spreading substrate, configured to be electrically connected to a positive sub-mount contact, and configured to be in contact with the heat spreading substrate, the heat spreading substrate positioned at a distance from the grounded substrate.

* * * * *